(12) United States Patent
Hiwada

(10) Patent No.: US 8,020,967 B2
(45) Date of Patent: Sep. 20, 2011

(54) LIQUID DISCHARGE APPARATUS AND METHOD FOR PRODUCING LIQUID DISCHARGE APPARATUS

(75) Inventor: Shuhei Hiwada, Toyoake (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 409 days.

(21) Appl. No.: 12/218,794

(22) Filed: Jul. 17, 2008

(65) Prior Publication Data

US 2009/0021558 A1 Jan. 22, 2009

(30) Foreign Application Priority Data

Jul. 18, 2007 (JP) ................................. 2007-187659
Jul. 19, 2007 (JP) ................................. 2007-188672

(51) Int. Cl.
B41J 2/135 (2006.01)
B41J 2/045 (2006.01)
H01L 41/22 (2006.01)
H01L 21/00 (2006.01)
H04R 17/00 (2006.01)

(52) U.S. Cl. .............. 347/44; 347/71; 29/25.35; 438/21
(58) Field of Classification Search .................... 347/70, 347/71

See application file for complete search history.

(56) References Cited

U.S. PATENT DOCUMENTS

| 5,610,371 | A | 3/1997 | Hashimoto et al. |
| 5,746,927 | A | 5/1998 | Hashimoto et al. |
| 7,055,936 | B2 | 6/2006 | Imai et al. |
| 7,370,943 | B2 | 5/2008 | Imai et al. |
| 2006/0044361 | A1* | 3/2006 | Sugahara ....................... 347/70 |
| 2006/0214536 | A1 | 9/2006 | Sugahara |

FOREIGN PATENT DOCUMENTS

JP 2004-114609 4/2004

OTHER PUBLICATIONS

Chinese Office Action for Chinese Patent Application No. 200810133668.8 dated Sep. 7, 2010.

* cited by examiner

Primary Examiner — Matthew Luu
Assistant Examiner — Lisa M Solomon
(74) Attorney, Agent, or Firm — Frommer Lawrence & Haug LLP

(57) ABSTRACT

There is provided a liquid discharge apparatus which includes a liquid channel which connects a discharge port and a pressure chamber; a piezoelectric layer one surface of which facing the pressure chamber; a power feeding electrode which applies a voltage to the piezoelectric layer; and a liquid electroconductive material which electrically connects the other surface of the piezoelectric layer and the power feeding electrode, and in an area on the other surface, of the piezoelectric layer, overlapping with the pressure chamber, a contact area which is an electrical contact between the piezoelectric layer and the liquid electroconductive material is formed. Accordingly, it is possible to provide a liquid discharge apparatus which is capable of realizing a small size channel unit and an improvement in a resolution of an image which is formed by a discharging liquid, and to change appropriately a shape of the piezoelectric layer.

8 Claims, 12 Drawing Sheets

FIRST STEP

SECOND STEP

THIRD STEP

FOURTH STEP

FIFTH STEP

SIXTH STEP

SEVENTH STEP

EIGHTH STEP

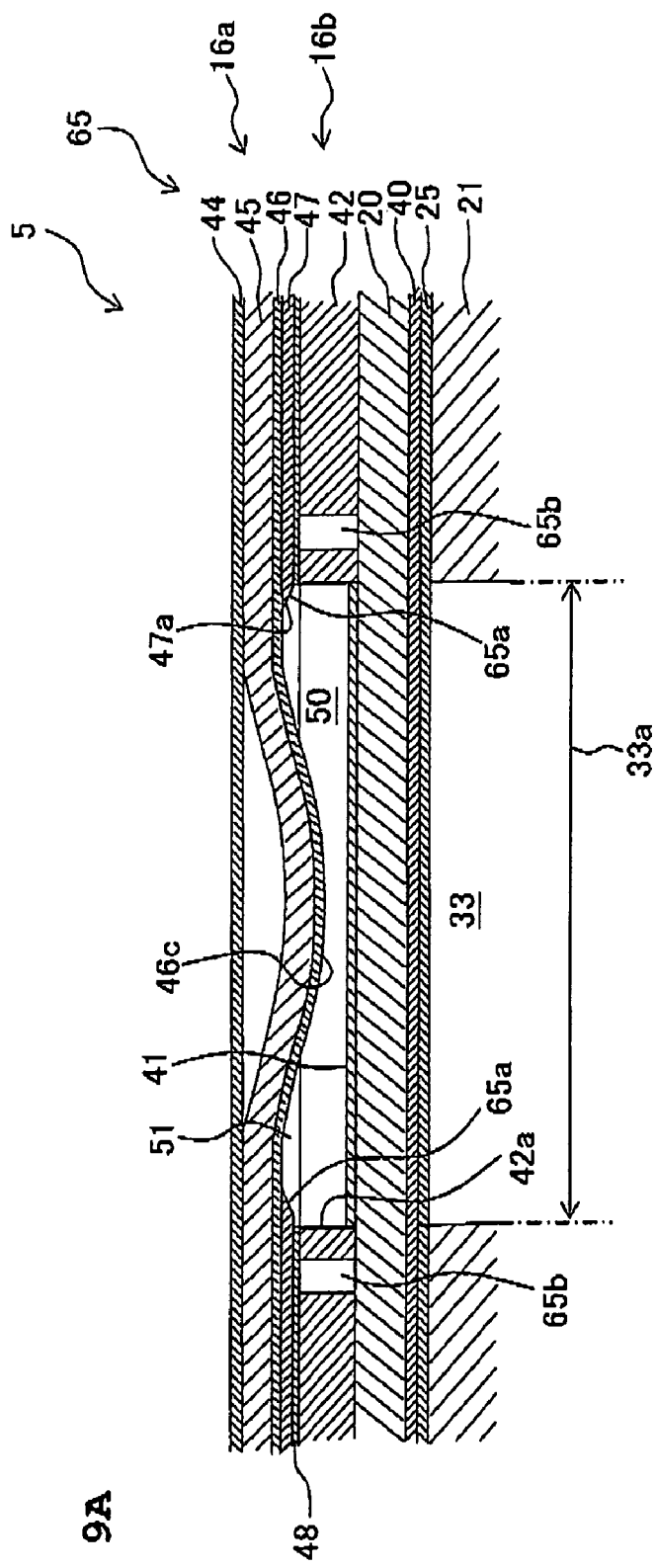
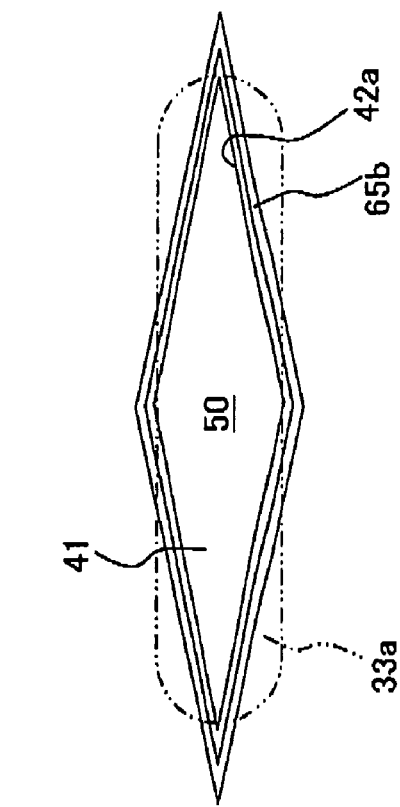
Fig. 9A
Fig. 9B

LIQUID DISCHARGE APPARATUS AND METHOD FOR PRODUCING LIQUID DISCHARGE APPARATUS

CROSS-REFERENCE TO RELATED APPLICATION

The present application claims priority from Japanese Patent Application Nos. 2007-187659 and 2007-188672, filed on Jul. 18, 2007 and Jul. 19, 2007, respectively, the disclosures of which are incorporated herein by references in their entirety.

BACKGROUND OF THE INVENTION

1. Field of the Invention

The present invention relates to a liquid discharge apparatus which includes pressure chambers provided in the intermediate portion of a liquid channel which communicates with a discharge head, a piezoelectric layer which changes a volume of the pressure chambers, and a power feeding electrode which is electrically connected to the piezoelectric layer, and which applies a voltage to the piezoelectric layer. The present invention also relates to a method for producing the liquid discharge apparatus.

2. Description of the Related Art

A liquid discharge apparatus such as an ink-jet printer, which jets a liquid such as an ink on to a recording medium through a discharge port formed at a down stream end of a liquid channel formed in a channel unit, has hitherto been known. Specifically, a pressure chamber having a predetermined volume and having an opening formed therein is formed at the middle of the liquid channel, and the opening of the pressure chamber is covered by a piezoelectric layer which deforms when a voltage is applied. In Japanese Patent Application Laid-open No. 2004-114609, the piezoelectric layer is sandwiched between a common electrode which is kept at a predetermined electric potential, and a drive electrode (individual electrode) which applies a predetermined electric potential different from the electric potential of the common electrode, when the voltage is applied. Furthermore, a power feeding electrode (a contact of an FPC) for applying the predetermined electric potential to the drive electrode is arranged corresponding to the drive electrode, and the drive electrode and the power feeding electrode are connected electrically by solder or an adhesive.

When an electric power is supplied to the power feeding electrode from an external power source, a voltage is applied to the drive electrode which is connected to the power feeding electrode, and an electric potential difference is developed between the drive electrode and the common electrode which is kept at the predetermined electric potential. As a result, a shape of the piezoelectric layer is changed and a volume of the pressure chamber is also changed. Due to the change in the volume of the pressure chamber, the liquid in the pressure chamber is pressurized, and is jetted to an outside from the discharge port through the liquid channel.

SUMMARY OF THE INVENTION

In a case of the liquid discharge apparatus having the abovementioned structure, an electrical contact between the drive electrode and the solder (an area on the individual electrode in which a land is formed) is provided on an outer side of an overlapping area of the piezoelectric layer and the pressure chamber. Generally, a hardened solder has a poor flexibility. Therefore, when the electrical contact between the solder and the drive electrode is provided in the overlapping area, there is a possibility that a change in the shape of the overlapping area of the piezoelectric layer is hindered in case the voltage is applied. When the change in the shape of the overlapping area is hindered, it becomes difficult to change appropriately the volume of the pressure chamber. To avoid this, a wire is extended from the drive electrode to an outside of the overlapping area to connect to the solder.

In that case, it is necessary to extend a wire for electrical connection up to an outer side of the overlapping area, for each of the pressure chambers as described above. Therefore, when there is a plurality of pressure chambers as in the ink-jet printer for example, it becomes difficult to have a highly integrated head (recording head). As a result, it becomes difficult to make the channel unit small, and to realize a high resolution for a printed matter such as a photograph.

In view of this, an object of the present invention is to provide a liquid discharge apparatus in which it is possible to change appropriately a shape of the piezoelectric layer while realizing a small size of the channel unit and an improvement in a resolution of an image formed by the liquid jetted, and a method of manufacturing the liquid discharge apparatus.

The present invention is made in view of the abovementioned circumstances. According to a first aspect of the present invention, there is provided a liquid discharge apparatus which discharges a liquid, including:

a liquid channel in which a discharge port through which the liquid is discharged is formed at one end of the liquid channel and a pressure chamber which stores the liquid is formed in an intermediate portion of the liquid channel;

a piezoelectric layer which deforms to change a volume of the pressure chamber when a voltage is applied to the piezoelectric layer, the piezoelectric layer having one surface facing the pressure chamber;

a power feeding electrode which is electrically connected to the piezoelectric layer to apply the voltage to the piezoelectric layer; and a liquid electroconductive material which electrically connects the other surface of the piezoelectric layer and the power feeding electrode;

wherein a contact area is formed, on the other surface of the piezoelectric layer, the contact area overlapping with the pressure chamber, the piezoelectric layer and the liquid electroconductive material being electrically contacted via the contact area.

According to the first aspect of the present invention, since the liquid electroconductive material is used for the electrical connection, it is possible to connect electrically the piezoelectric layer and the power feeding electrode without hindering the shape change in the area of the piezoelectric layer. In addition to this, since the contact area between the piezoelectric layer and the liquid electroconductive material is positioned to overlap with the pressure chamber, it is possible to realize a high integration of the pressure chamber. It is possible to make small a size of a channel unit in which a plurality of liquid channels having such pressure chambers at an intermediate portion thereof is provided, and to improve a high resolution of an image formed by a discharging liquid.

In the liquid discharge apparatus of the present invention, may further include a drive electrode which overlaps with the contact area and which is joined on the other surface of the piezoelectric layer, wherein the piezoelectric layer and the power feeding electrode may be connected electrically with the liquid electroconductive material via the drive electrode. In this case, it is possible to connect the liquid electroconductive material and the piezoelectric layer by a low resistance.

In other words, when the piezoelectric layer and the liquid electroconductive material are connected directly, since the piezoelectric layer formed by a method such as an aerosol deposition method (AD method) has a rough surface, it is difficult to secure a sufficient contact area, and there is a possibility that a resistance at the contact point becomes high depending on a viscosity of the liquid electroconductive material, (in other words, when the viscosity is comparatively higher). Whereas, when the piezoelectric layer and the liquid electroconductive material are joined via a drive electrode which is provided separately on a surface of the piezoelectric layer, by using a material having a comparatively smooth surface, it is possible to secure substantially a contact area between the drive electrode and the liquid electroconductive material, and as a result, it is possible to connect the piezoelectric layer and the liquid electroconductive material by a low resistance. As the drive electrode, it is possible to use an electrode which is formed on the surface of the piezoelectric layer by a hitherto known method of screen printing an electroconductive paste (such as silver-palladium paste), and then drying the electroconductive paste which is screen printed. The drive electrode formed in such manner is in a sufficiently close contact with the piezoelectric layer, and has a comparatively smooth outer surface.

In the liquid discharge apparatus of the present invention, an electroconductive material accommodating space which is liquid-tight and which accommodates the liquid electroconductive material may be formed between the contact area of the piezoelectric layer and the power feeding electrode. In this case, it is possible to fill the liquid electroconductive material into the electroconductive material accommodating space.

The liquid discharge apparatus of the present invention may further include a first insulating layer which is provided on the other surface of the piezoelectric layer; wherein a first through hole in which the contact area is exposed and which defines the electroconductive material accommodating space may be formed in the first insulating layer. In this case, it is possible to insulate electrically the other surface of the piezoelectric layer excluding the contact area. Furthermore, it is possible to accommodate the liquid electroconductive material in the first through hole of the first insulating layer by making an arrangement such that the liquid electroconductive material makes a contact assuredly with the contact area.

The liquid discharge apparatus of the present invention may further include a circuit board including a substrate on one surface of which the power feeding electrode is provided, a wire which is provided on the one surface of the substrate to be electrically connected with the power feeding electrode, and a second insulating layer which covers the wire on the substrate, wherein a second through hole in which a surface, of the power feeding electrode, facing the contact area is partially exposed may be formed in the second insulating layer; and the first insulating layer and the second insulating layer may be joined such that the first through hole and the second through hole communicate mutually to define the electroconductive material accommodating space.

In this case, it is possible to expose only the surface of the power feeding electrode, facing the contact area, and to insulate electrically the wires etc. other than the surface facing. Furthermore, it is possible to accommodate the liquid electroconductive material in the second through hole of the second insulating layer such that the liquid electroconductive material assuredly makes a contact with the exposed portion of the power feeding electrode. Furthermore, it is possible to form the electroconductive material accommodating space by such first through hole and the second through hole, and to fill the liquid electroconductive material in the electroconductive material accommodating space.

In the liquid discharge apparatus of the present invention, the power feeding electrode may have a bump which is protruded toward the piezoelectric layer to be inserted into the first through hole. In this case, it is possible to bring assuredly the power feeding electrode and the liquid electroconductive material in contact by immersing the bump into the liquid electroconductive material.

In the liquid discharge apparatus of the present invention, the bump may be one of a press bump which is formed by pressing the power feeding electrode, a solder bump which is formed by performing soldering on the power feeding electrode, and a spiral contact. When the bump is a press bump or a solder bump, it is possible to form the bump easily at a low cost. When the bump is a spiral contact, it is possible to bring assuredly the bump and the liquid electroconductive material in contact.

In the liquid discharge apparatus of the present invention, the electroconductive material accommodating space may have an extra volume in addition to a volume for accommodating the liquid electroconductive material. In this case, even when the liquid electroconductive material undergoes a thermal expansion when the liquid discharge apparatus is used, it is possible to accommodate an amount of volume increased due to the expansion, in the extra volume portion of the electroconductive material accommodating space.

In the liquid discharge apparatus of the present invention, a recess which is capable of accommodating the liquid electroconductive material leaked out from the first through hole, may be formed around the first through hole formed in the first insulating layer. In this case, at the time of joining the piezoelectric layer and the power feeding electrode via the first insulating layer, even when the liquid electroconductive material has leaked out from the first through hole forming the electroconductive material accommodating space, it is possible to receive the liquid electroconductive material leaked out in the recess. Therefore, it is possible to prevent the liquid electroconductive material from spreading.

According to a second aspect of the present invention, there is provided a method for producing a liquid discharge apparatus which includes a liquid channel in which a discharge port through which the liquid is discharged is formed at one end of the liquid channel and a pressure chamber which stores the liquid is provided at an intermediate portion of the liquid channel; a piezoelectric layer which deforms to change a volume of the pressure chamber when a voltage is applied to the piezoelectric layer, the piezoelectric layer having one surface facing the pressure chamber; and a power feeding electrode which is electrically connected to the piezoelectric layer to apply the voltage to the piezoelectric layer, the method comprising:

providing the piezoelectric layer such that the one surface of the piezoelectric layer faces the pressure chamber;

providing a first insulating layer having a first through hole formed therein on the other surface of the piezoelectric layer such that the first through hole overlaps with the pressure chamber to expose a part of the other surface of the piezoelectric layer in the first through hole;

injecting a liquid electroconductive material into the first through hole; and joining the power feeding electrode to the piezoelectric layer via the first insulating layer such that the power feeding electrode faces the other surface of the piezoelectric layer in the area via the first through hole.

According to the second aspect of the present invention, it is possible to connect electrically the piezoelectric layer and the power feeding electrode without hindering the shape change in the area of the piezoelectric layer, and to produce the liquid discharge apparatus which is capable of realizing a high integration of the pressure chamber. Moreover, it is possible to manufacture the liquid discharge apparatus in which only an appropriate area of the piezoelectric layer is brought in contact with the liquid electroconductive material through the first through hole.

According to a third aspect of the present invention, there is provided a method for producing a liquid discharge apparatus which includes a liquid channel in which a discharge port through which the liquid is discharged is formed at one end of the liquid channel and a pressure chamber which stores the liquid is provided at an intermediate portion of the liquid channel; a piezoelectric layer which deform to change a volume of the pressure chamber when a voltage is applied to the piezoelectric layer, the piezoelectric layer having one surface facing the pressure chamber; and a power feeding electrode which is electrically connected to the piezoelectric layer to apply the voltage to the piezoelectric layer, the method comprising:

providing the piezoelectric layer such that the one surface of the piezoelectric layer faces the pressure chamber;

joining a drive electrode to the other surface of the piezoelectric layer such that the drive electrode corresponds to a position of the pressure chamber;

providing a first insulating layer having a first through hole formed therein on the other surface of the piezoelectric layer such that the pressure chamber, the drive electrode, and the first through hole overlap with one another to expose the drive electrode in the first through hole;

injecting a liquid electroconductive material into the first through hole; and joining the power feeding electrode to the piezoelectric layer via the first insulating layer such that the power feeding electrode faces the other surface of the piezoelectric layer via the first through hole.

According to the third aspect of the present invention, it is possible to realize a high integration of the pressure chamber without hindering the shape change in the area of the piezoelectric layer similarly as according to the second aspect, and to produce a liquid discharge apparatus in which it is possible to connect the liquid electroconductive material and the piezoelectric layer at a low resistance by the drive electrode. Moreover, it is possible to manufacture the liquid discharge apparatus in which only an appropriate area of the piezoelectric layer is brought in contact with the liquid electroconductive material.

The method for producing the liquid discharge apparatus of the present invention may further include: forming a bump on the power feeding electrode, the bump protruding toward the piezoelectric layer;

wherein the joining of the power feeding electrode to the piezoelectric layer may include joining the power feeding electrode to the piezoelectric layer via the first insulating layer such that the bump is inserted into the first through hole. In this case, it is possible to produce the liquid discharge apparatus in which the power feeding electrode and the liquid electroconductive material are connected assuredly by immersing the bump in the liquid electroconductive material.

The method for producing the liquid discharge apparatus of the present invention may further include: covering a facing surface, of the power feeding electrode, facing the piezoelectric layer with a second insulating layer, a second through hole in which the facing surface is partially exposed being formed in the second insulating layer; wherein the joining of the power feeding electrode to the piezoelectric layer may include joining the first insulating layer and the second insulating layer such that the first through hole and the second through hole communicate with each other. In this case, it is possible to produce the liquid discharge apparatus in which the liquid electroconductive material is filled in the space which is formed by the first through hole and the second through hole. Moreover, it is possible to manufacture the liquid discharge apparatus in which only an appropriate area of the power feeding electrode is brought in contact with the liquid electroconductive material by the second through hole.

In the liquid discharge apparatus of the present invention and the method for producing the liquid discharge apparatus of the present invention, the liquid electroconductive material may be formed of a material which is selected from a group consisting of an electroconductive adhesive including an electroconductive filler and a binder of a silicon resin, an ionic liquid, an electroconductive polymer, and a liquid metal. In this case, since it is possible to use a material having a high electrical conductivity and a low viscosity as the liquid electroconductive material, there is no fear of hindering the deformation of the electroconductive layer. Moreover, it is also possible to use a commercially available material as the liquid electroconductive material.

According to the liquid discharge apparatus and the method for producing the liquid discharge apparatus according to the present invention, it is possible to realize a liquid discharge apparatus in which it is possible to connect electrically the piezoelectric layer and the power feeding electrode without hindering the change in the shape of the piezoelectric layer, in an area occupied by the pressure chamber when viewed in a direction of thickness of the piezoelectric layer. Moreover, it is possible to realize a liquid discharge apparatus in which, it is possible to realize a high integration of the pressure chamber, a small shape of a channel unit in which a liquid channels having such pressure chambers midway are provided in plurality, and an improvement in a resolution of an image formed by the discharging liquid.

BRIEF DESCRIPTION OF THE DRAWINGS

FIG. 9A and FIG. 9B are diagrams showing a structure of an actuator in a liquid discharge apparatus according to a third embodiment, where, FIG. 9A shows a partial cross-sectional view and FIG. 9B shows a plan view of a first insulating layer;

DETAILED DESCRIPTION OF THE PREFERRED EMBODIMENTS

A liquid droplet discharging apparatus and a method for producing the liquid droplet discharging apparatus according to embodiments of the present invention will be described below with reference to the accompanying diagrams showing an example of an ink-jet printer.

First Embodiment

Figure 1:
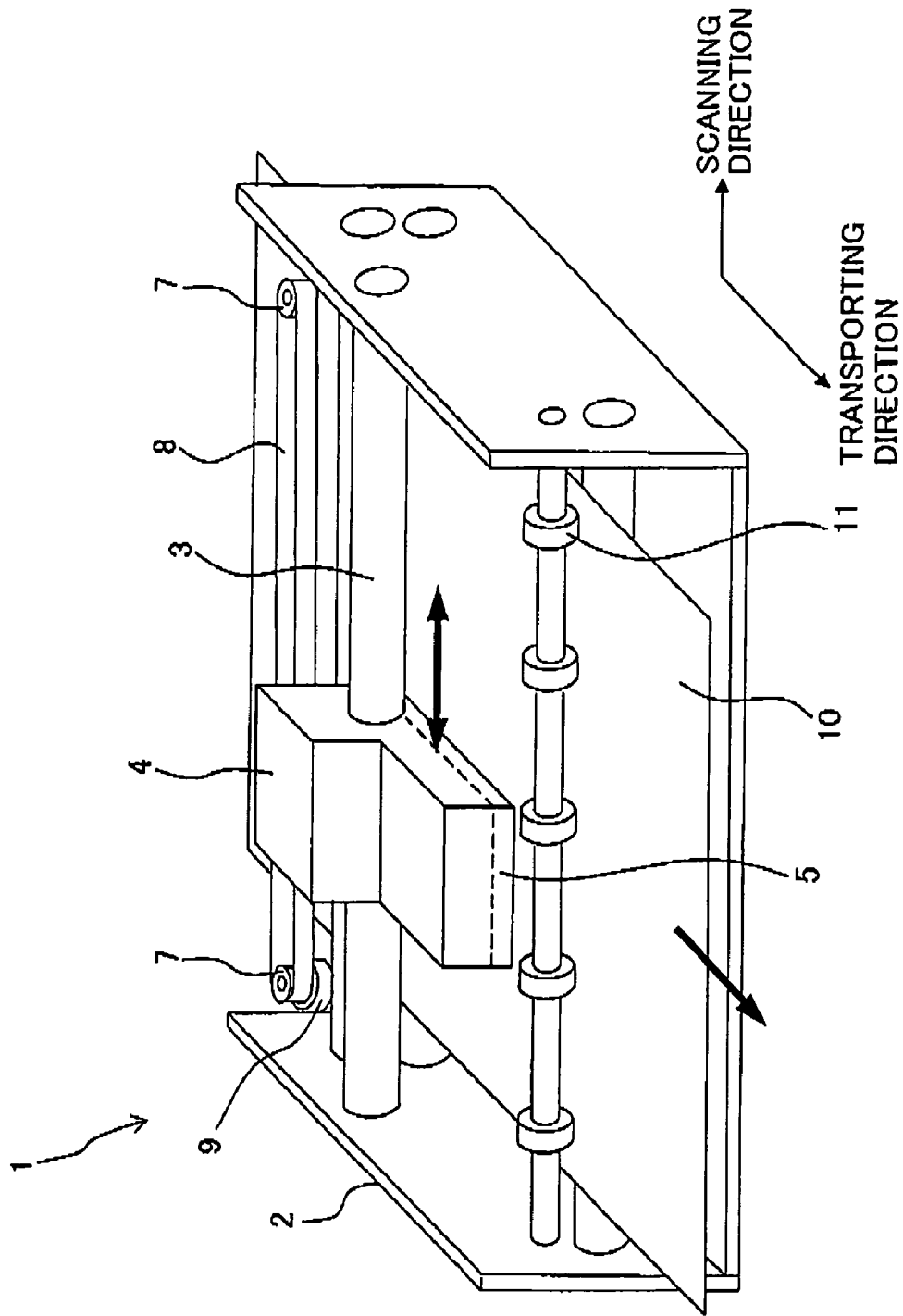
FIG. 1 is a schematic perspective view of a liquid discharge apparatus according to a first embodiment of the present invention.

FIG. 1 is a schematic cross-sectional view of a liquid discharge apparatus 1 according to a first embodiment of the present invention. As shown in FIG. 1, the liquid discharge apparatus 1 which is an ink-jet printer, has a guide rod 3 which is installed in a casing 2, and a carriage 4 which is slidably supported by the guide rod 3. A recording head 5 is provided at a lower side of the carriage 4, and the recoding head 5 jets an ink (liquid) downward.

Two pulleys 7 are arranged near both of end portions of the guide rod 3, respectively, and a timing belt 8 is put around the two pulleys 7. An output shaft of a motor 9 which rotates in a normal and a reverse direction (CW and CCW directions) is coupled with the one of the pulleys 7. Therefore, the timing belt 8 is rotated in one direction or the other direction according to a driving of the motor 9. Moreover, the carriage 4 is connected to the timing belt 8, and with the rotation of the timing belt 8, the carriage 4 and the recording head 5 reciprocate in one direction or the other direction along the guide rod 3.

A portion under the recording head 5 is a transporting path of a recording medium (recording paper) 10, and the recording medium 10 is transported under the recording head 5 along the transporting path by paper transporting rollers 11 which are provided to the casing 2 such that an axis of rotation is parallel to the guide rod 3. When the recording head 5 is positioned above the recording paper 10, the recording head 5 is made to reciprocate while transporting the recording paper 10 intermittently. At the same time, it is possible to form a desired image by discharging the ink from the recording head 5 at a predetermined position on the recording paper 10.

In the following description, a 'scanning direction' means a direction in which the recording head 5 moves along the guide rod 3, and a 'transporting direction' means a direction in which the recording paper 10 is transported under the recording head 5. Other cases and other directions will be described appropriately.

Figure 2:
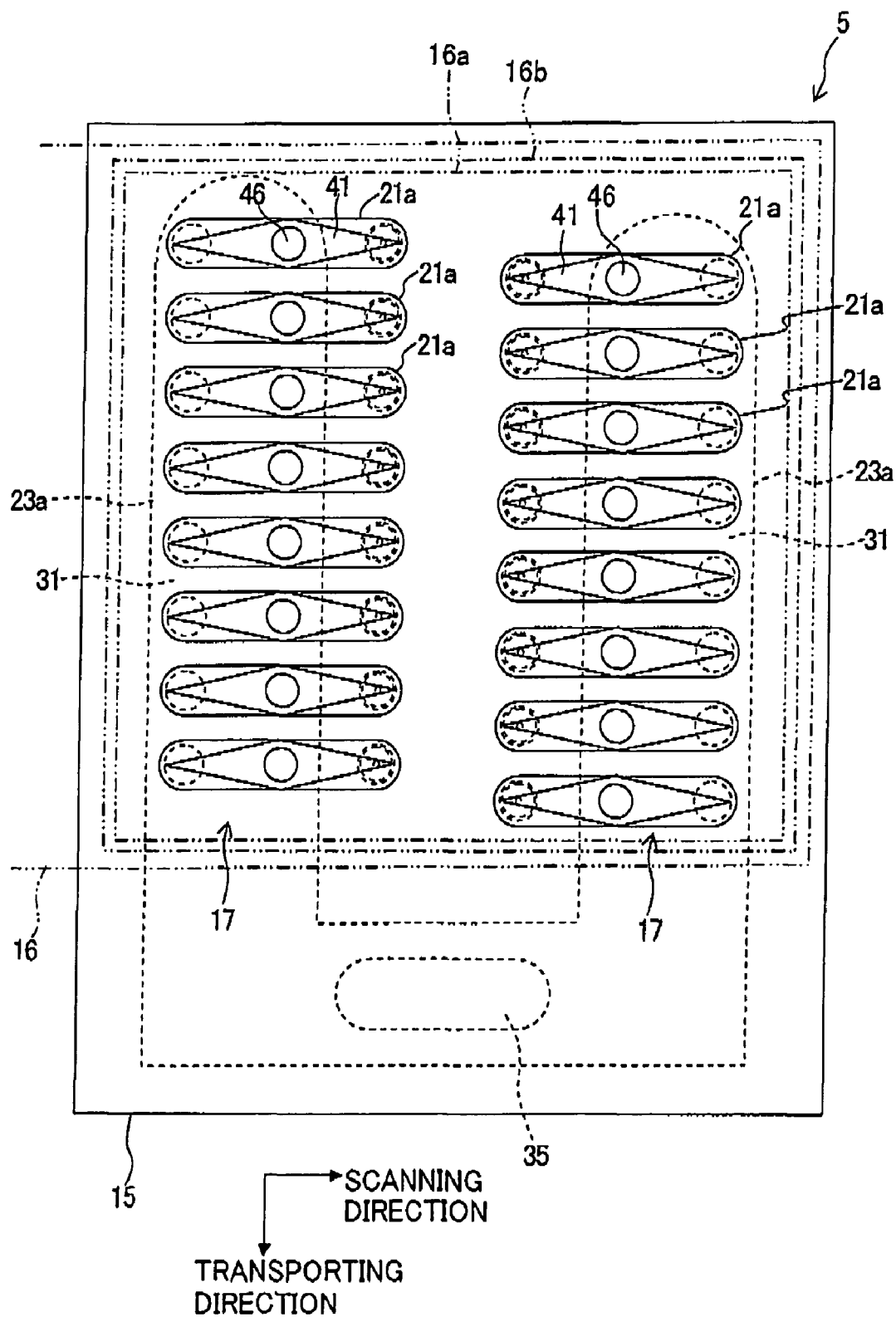
FIG. 2 is a schematic plan view of a recording head shown in FIG. 1, when viewed from a top.
Figure 3:
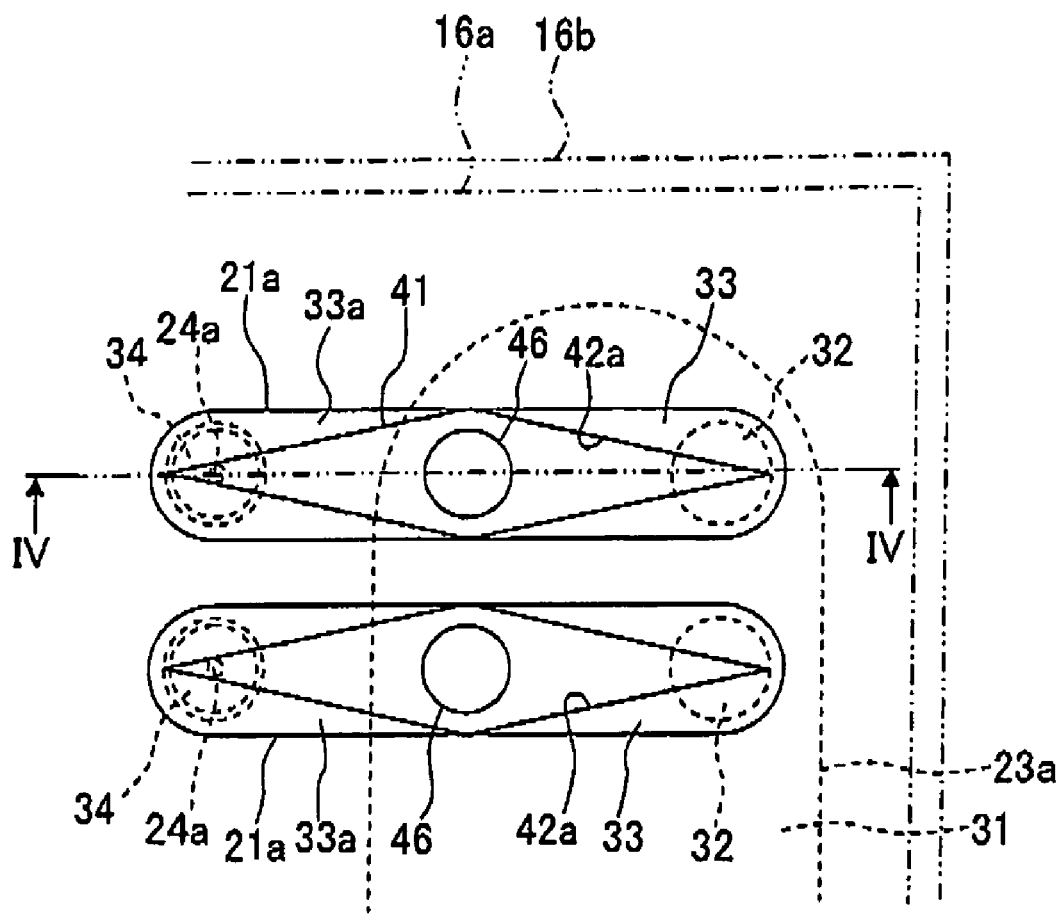
FIG. 3 is a schematic plan view showing in an enlarged form, a portion of the recording head shown in FIG. 2.
Figure 4:
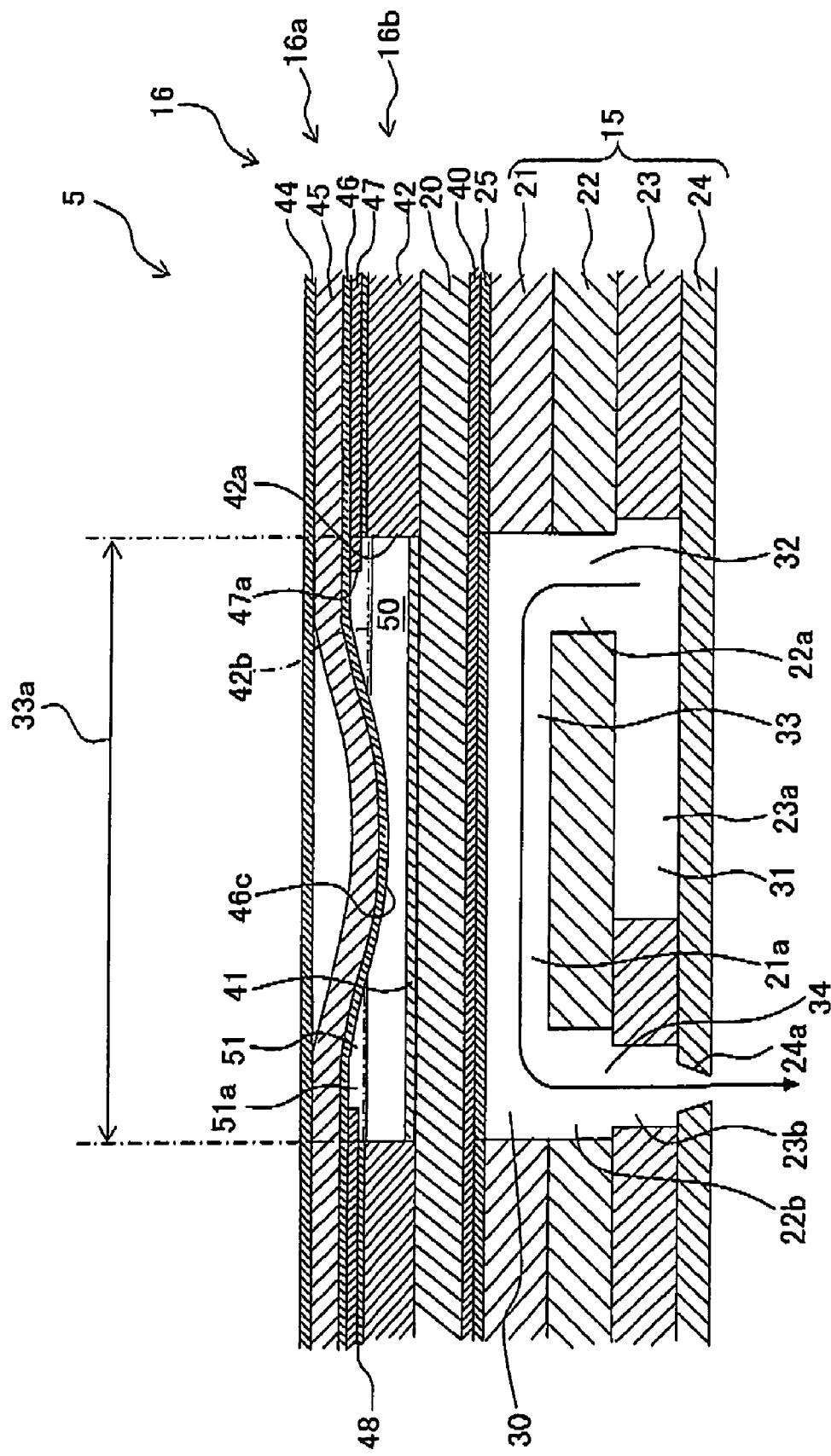
FIG. 4 is a schematic cross-sectional view when the recording head shown in FIG. 3 is cut along a line IV-IV.

FIG. 2 is a schematic plan view of the recording head 5, when viewed from a top. FIG. 3 is a schematic plan view showing in an enlarged form, a portion of the recording head 5 shown in FIG. 2. FIG. 4 is a schematic cross-sectional view of the recording head 5 along a IV-IV line. As shown in FIG. 2, the recording head 5 mainly includes a channel unit 15 in which a liquid channel 30 (refer to FIG. 4) which will be described later is formed, and an actuator 16 which is connected to an upper surface of the channel unit 15. A plurality of pressure chamber hole rows 17 (two pressure chamber hole rows in FIG. 2) extended in the scanning direction is arranged at an upper portion of the channel unit 15. The pressure chamber hole rows 17 are adjacent in the transporting direction. Each of the pressure chamber hole rows 17 has a plurality of pressure chamber holes 21a each having an elliptical shape, with a longer side of the ellipse in the scanning direction. Moreover, the actuator 16 is a chip on film (COF) 16a having supply electrodes (power feeding electrode) 46 each of which is provided to correspond to one of the pressure chamber holes 17, and a drive layer 16b which is formed by a piezoelectric layer 20 which will be described later, which is deformed upon applying a voltage to the supply electrode (power feeding electrode) 46 (also refer to FIG. 4).

Recording Head

A structure of the recording head 5 will be described in further detail with reference to FIGS. 3 and 4. Firstly, as shown in FIG. 4, the channel unit 15 includes in order from a top, a pressure chamber plate 21, a connecting channel plate 22, a manifold plate 23, and a nozzle plate 24, which are adhered in a stacked form.

The pressure chamber holes 21a (also refer to FIG. 3) each having an elliptical shape as described above, are formed in the pressure chamber plate 21. The connecting channel plate 22 is connected to a lower surface of the pressure chamber plate 21, and a plurality of liquid inflow holes 22a each of which communicates with one end of one of the pressure chambers hole 21a, and a plurality of first liquid outflow holes 22b each of which communicates with the other end of the one of the pressure chamber holes 21a are formed in the connecting channel plate 22. The manifold plate 23 has a manifold hole 23a having a comparatively larger opening area, which is extended in the transporting direction (also refer to FIG. 2). The manifold hole 23a communicates with all the pressure chamber holes 21a in one of the pressure chamber hole rows 17 (refer to FIG. 2), via the liquid inflow holes 22a. Moreover, a plurality of second liquid outflow holes 23b are formed in the manifold plate 23. Each of the second liquid outflow holes 23b communicates with one of the pressure chamber holes 21a via one of the first liquid outflow holes 22b. The nozzle plate 24 has a plurality of nozzle holes 24a each of which communicates with one of the pressure chamber holes 21a via one of the first liquid outflow holes 22b and one of the second liquid outflow holes 23b, and a diameter of an opening of the nozzle holes 24a is progressively narrowed downward (is tapered).

The pressure chamber plate 21, the connecting channel plate 22, the manifold plate 23, and the nozzle plate 24 are stacked and adhered. The manifold hole 23a described above, is covered by the nozzle plate 24 and the connecting channel plate 22, thereby forming a plurality of common liquid chambers 31. In other words, the manifold hole 23a is covered by a portion of the nozzle plate 24 excluding the nozzle holes 24a, and is covered partially from an upper side by a portion excluding the liquid inflow holes 22a and the first liquid outflow holes 22b of the connecting channel plate 22. Moreover, the pressure chamber holes 21a are covered from an upper side by a vibration plate 25 made of a metallic material which is stacked on and adhered to the pressure chamber plate 21, and are covered partially from a lower side by a portion excluding the liquid inflow holes 22a and the first liquid outflow holes 22b in the connecting channel plate 22. Accordingly, a plurality of pressure chambers 33 is formed.

Furthermore, the liquid inflow holes 22a formed in the connecting channel plate 22 form a plurality of liquid inflow channels (passages) 32 each of which makes communicate the common liquid chamber 31 and one of the pressure chambers 33; and the first liquid outflow holes 22b and the second liquid outflow holes 23b, which are formed in the connecting channel plate 22 and the manifold plate 23 respectively, and which communicate with each other, form a plurality of liquid outflow channels 34 each of which makes communicate one of the pressure chambers 33 and one of the nozzle holes 24a. Moreover, a plurality of continuous liquid channels 30 through which the ink flows is formed by the common liquid chamber 31, the liquid inflow channels 32, the pressure chambers 33, the liquid outflow channels 34, and the nozzle holes 24a.

As shown in FIG. 2, the two common liquid chambers 31 provided to correspond to the two pressure chamber hole rows 17 are communicated with each other. These common liquid chambers 31 communicate with an ink tank (not shown in the diagram) which is provided separately from the recording head 5, via a through hole 35 formed in the pressure chamber plate 21 and the connecting channel plate 22. Consequently, the ink from the ink tank is supplied to the common liquid chamber 31 through the through hole 35, and is filled in the liquid channel 30 which runs from the common liquid chambers 31 up to the nozzle holes 24a. When the vibration plate 25 which forms an upper wall of the pressure chambers 33 vibrates due to driving of the actuator 16, a volume of the pressure chambers 33 is changed, and a pressure is applied to the ink inside the pressure chambers 33. Due to the pressure applied, the ink is fed forcefully to an upstream side of the liquid channels 30, and is jetted to an outside through the nozzle holes 24a.

Actuator

Next, the actuator 16 will be described below. As shown in FIG. 4, the actuator 16 includes a chip on film (COF) 16a at an upper layer, and a drive layer 16b at a lower layer. The drive layer 16b has the piezoelectric layer 20, a common electrode 40 and a plurality of drive electrodes 41 which sandwich the piezoelectric layer 20, and a first insulating layer 42 which is stacked on an upper surface of the piezoelectric layer 20.

The drive layer 16b will be described below in detail. The common electrode 40 is stacked on an upper surface (a surface on an opposite side of a surface facing the channel unit 15) of the vibration plate 25, and the piezoelectric layer 20 is stacked on an upper surface of the common electrode 40. The piezoelectric layer 20 is formed of a piezoelectric material which is mainly composed of lead zirconate titanate (PZT) which is a solid solution of lead titanate and lead zirconate, and which is a ferroelectric substance. The piezoelectric layer 20 is formed as a layer spread over (covering) the plurality of pressure chambers 33 on the upper surface of the common electrode 40. As a method for forming the piezoelectric layer 20, a known film forming technology may be used. For instance, it is possible to use an AD (aerosol deposition) method in which fine particles of a submicron size are mixed with a gas to make an aerosol, and are blown through a nozzle. A non electroconductive layer (insulating layer) of a material such as alumina is formed as a film on an upper surface of the vibration plate 25, and the common electrode 40 is arranged on an upper surface of the non electroconductive layer. Therefore, the vibration plate 25 and the common electrode 40 are mutually insulated electrically.

The drive electrodes 41 are arranged on the upper surface of the piezoelectric layer 20, and it is possible to form the drive electrodes 41 by screen printing an electroconductive paste such as silver-palladium paste. The drive electrodes 41 are provided on the upper surface of the piezoelectric layer 20, in an area overlapping with the pressure chambers 33 when viewed from a direction of thickness (in a plan view) of the piezoelectric layer 20, in other words, are provided in a pressure chamber area 33a (refer to FIG. 3 and FIG. 4), on the upper surface of the piezoelectric layer 20. Moreover, as shown in FIG. 3, each of the drive electrodes 41 according to the first embodiment, is formed as a rhombus having a diagonal of a substantially same dimension as a dimension in a longitudinal direction and a dimension in a cross direction (a direction of width) of the pressure chamber area 33a having an elliptical shape. Furthermore, each of the drive electrodes 41 is arranged not to stick out from the pressure chamber area 33a (arranged to be accommodated entirely in the pressure chamber area 33a). Since the pressure chamber area 33a is an area overlapping with the pressure chambers 33 in a plan view as mentioned above, it is preferable that a portion of the piezoelectric layer 20, overlapping with the pressure chamber area 33a is substantially deformable when the ink is jetted from the nozzle holes 24a.

The first insulating layer 42 is stacked on the upper surface of the piezoelectric layer 20, and has a plurality of first through holes 42a formed therein, each of which exposes one of the drive electrodes 41, each corresponding to one of the drive electrodes 41. The first insulating layer 42 is formed of a non electroconductive material such as polyimide, and is thicker than the drive electrodes 41. As shown in FIG. 3, each of the first through holes 42a has a rhombus shape similarly as the drive electrodes 41, and an upper surface of the drive electrodes 41 are exposed through the first through holes 42a. Moreover, a liquid electroconductive material 50 is accommodated (filled) in a recess shaped space which is formed by the first through holes 42a and the drive electrodes 41.

On the other hand, the chip on film 16a forming an upper layer of the actuator 16 has a holding plate 44 made of a metallic material, and a TAB sheet 45 made of polyimide is provided on a lower surface of the holding plate 44. Moreover, the plurality of power feeding electrodes 46 provided to correspond to the respective pressure chambers 33, and a second insulating layer 47 in which a plurality of second through holes 47a each of which partially exposes one of the power feeding electrodes 46 is formed, are provided on a lower surface of the TAB sheet 45. The second insulating layer 47 is formed of resist. The second insulating layer 47 may be formed of polyimide, and the TAB sheet 45 may be formed of resist.

Each of the power feeding electrodes 46 is arranged to face one of the drive electrodes 41 of the drive layer 16b, when the chip on film 16a is joined to the drive layer 16b. As shown in a bottom view in FIG. 5, each of the power feeding electrodes 46 includes an electrode portion 46a having a disc shape, and a wire connecting portion 46b which is extended outward from the electrode portion 46a. A bump 46c which protrudes downward is formed at a central portion of the electrode portion 46a by press molding (refer to FIG. 4), and one end of a wire 46d which connects with a driver IC (not shown in the diagram) of the chip on film 16a is connected to the wire connecting portion 46b.

Figure 5:
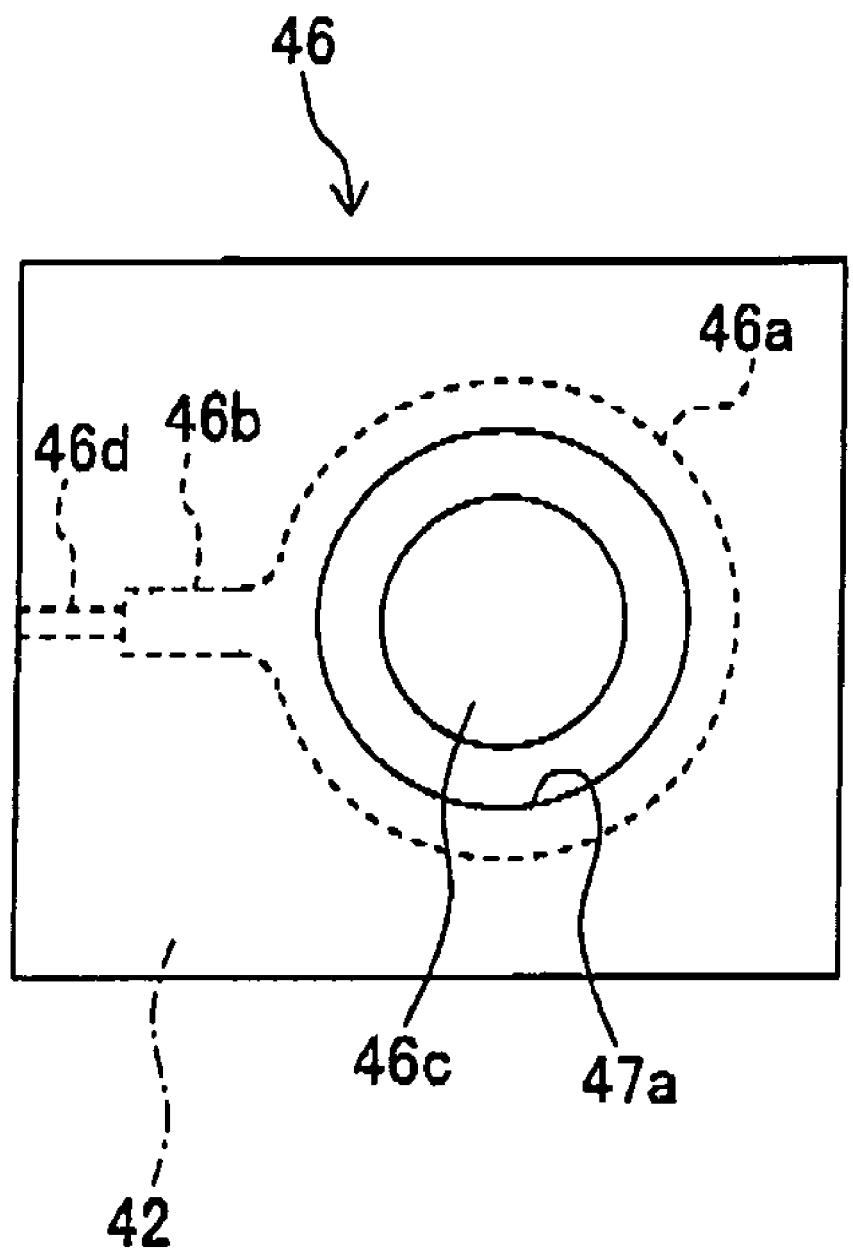
FIG. 5 is a bottom view showing a structure of a power feeding electrode.

Moreover, as shown in FIG. 5, each of the second through holes 47a in the second insulating layer 47 has a circular shaped opening, and is provided to correspond to one of the power feeding electrodes 46. In the second insulating layer 47, a central portion of each of the power feeding electrodes 46, including the bump 46c in the electrode portion 46a is exposed through the second through hole 47a; and the rest of the portion of the power feeding electrode 46, and the lower surface of the TAB sheet 45 on which the wire 46d is installed are covered (coated) with the second insulating layer.

As shown in FIG. 4, the abovementioned upper surface of the first insulating layer 42 of the drive layer 16b and a lower surface of the second insulating layer 47 of the chip on film 16a are adhered by an adhesive 48. Accordingly, a liquid-tight (fluid-tight) electroconductive material accommodating space 51 is formed by the first through hole 42a, the second through hole 47a, the piezoelectric layer 20 (or the drive electrodes 41), and the power feeding electrodes 46, and the liquid electroconductive material 50 is filled in the electroconductive material accommodating space 51. Moreover, the electroconductive material accommodating space 51 has an extra volume in addition to a volume of the liquid electroconductive material 50. In other words, an extra space 51a in which no liquid electroconductive material 50 is filled is formed near a peripheral portion of the bump 46c in the electroconductive material accommodating space 51.

In the abovementioned description, the first insulating layer 42, the second insulating layer 47, and the adhesive 48 are provided independently. However, the independent adhesive 48 is unnecessary, provided that the first insulating layer 42 and the second insulating layer 47 are made of a material having an adhesive property on a surface thereof.

Furthermore, the bump 46c of the power feeding electrode 46 is arranged to face the power feeding electrode 46 when the chip on film 16a is joined to the drive layer 16b. The bump 46c is protruded downward from an opening surface 42b of the first insulating layer 42 (refer to FIG. 4), and is immersed into the liquid electroconductive material 50. As a result, the drive electrode 41 and the power feeding electrode 46 are electrically connected to the liquid electroconductive material 50.

Method for Producing Actuator

A producing method for the abovementioned actuator 16 will be described below with reference to FIGS. 6A to 6D, and 7A to 7D. As shown in FIGS. 6A to 6D, in steps from a first step to a fourth step of the producing method, the drive layer 16b is formed on an upper portion of the channel unit 15, and in steps from a fifth step to a seventh step shown in FIGS. 7A to 7C, the chip on film 16a is formed, and in an eighth step shown in FIG. 7D, the actuator 16 is formed finally.

Firstly, in the first step, the common electrode 40 is stacked on the upper surface of the vibration plate 25 which is provided on the upper portion of the channel unit 15, and further, the piezoelectric layer 20 is stacked on the upper surface of the common electrode 40. In the second step, the drive electrodes 41 are arranged on the upper surface of the piezoelectric layer 20 (refer to FIG. 6A). Accordingly, the common electrode 40 is joined to a lower surface (surface facing the pressure chambers 33) of the piezoelectric layer 20, the drive electrodes are joined to the upper surface of the piezoelectric layer 20. Moreover, at the time of joining the drive electrodes 41 to the piezoelectric layer 20, the drive electrodes 41 are to be provided to correspond with (more elaborately, to overlap with) a position of the pressure chambers 33. In other words, the drive electrodes 41 are arranged to be overlapping with the pressure chambers respectively.

Figure 6A:
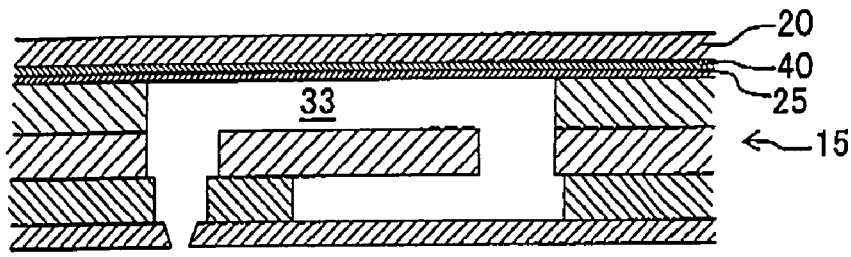
FIG. 6A to FIG. 6D are diagrams showing steps from a first step to a fourth step of a method of manufacturing an actuator.
Figure 6B:
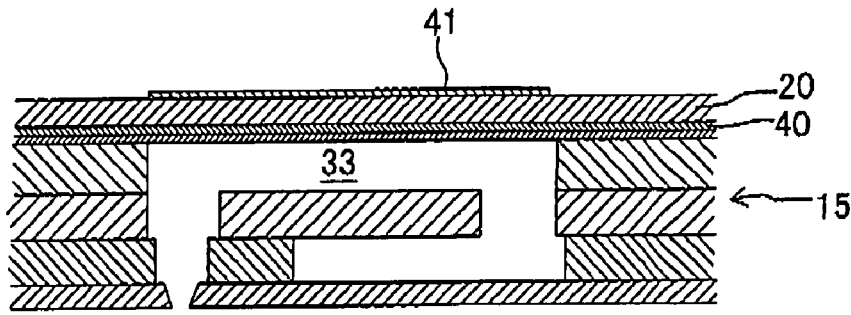
Figure 6C:
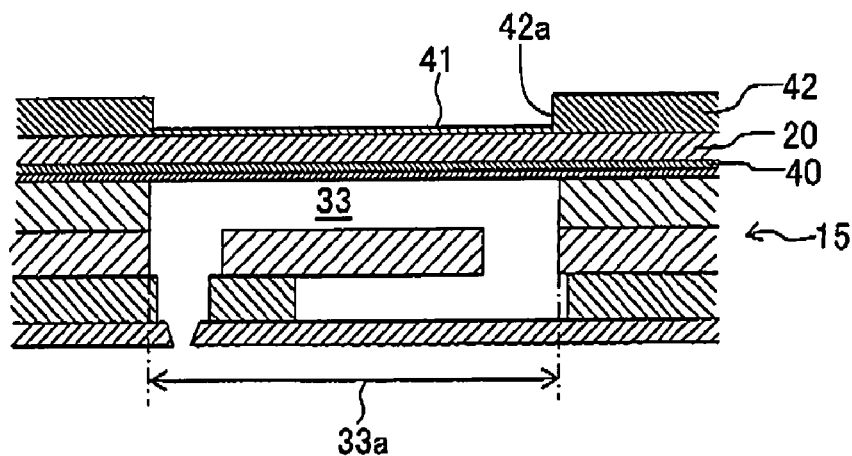
Figure 6D:
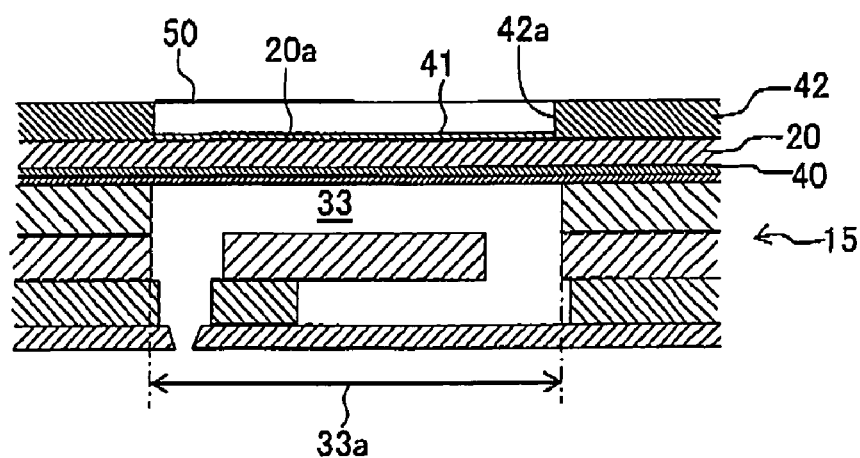

In the third step, the first insulating layer 42 having the firth through holes 42a formed therein, is stacked on the upper surface of the piezoelectric layer 20 (refer to FIG. 6C). At this time, the drive electrodes 41 are arranged to be exposed through the first through holes 42a. In this case, the first insulating layer 42 is arranged such that the pressure chamber area 33a, the drive electrodes 41, and the firth through holes 42a overlap with each other. It is possible to form the first insulating layer 42 by a method such as a photolithography and a screen printing. In a case of forming the first insulating layer 42 by the photolithography, the first through holes 42a of the abovementioned shape can be formed by a method in which a surface of a photosensitive substance applied is partially masked, and the masked photosensitive substance is exposed to light. Moreover, from a point of view of forming a minute (fine) first through holes 42a, it is preferable to use the photolithography than the screen printing.

In the fourth step, the liquid electroconductive material 50 is injected (filled) into the first through holes 42a (refer to FIG. 6D), and the piezoelectric layer 20 and the liquid electroconductive material 50 are connected electrically via the drive electrodes 41. Here, an electric contact area 20a (same as an area in which the drive electrode 41 and the piezoelectric layer 20 are joined in the first embodiment) of the piezoelectric layer 20 and the liquid electroconductive material 50 is positioned in the pressure chamber area 33a. Moreover, an amount to be injected of the liquid electroconductive material 50 being substantially small, normally it is difficult to inject the liquid electroconductive material 50. However, it is possible to inject the liquid electroconductive material 50 by a hitherto known method such as a method in which the liquid electroconductive material 50 is sucked up in an extremely thin glass tube by a capillary phenomenon, and is transferred into the first through holes 42a by bringing a front tip of the glass tube close to the upper surface of the drive electrodes 41 inside the first through holes 42a.

On the other hand, in the fifth step, the power feeding electrodes 46 as shown in FIG. 5 are adhered to the lower surface of the TAB sheet 45 which has been wired in advance (refer to FIG. 7A), and the power feeding electrodes 46 and the wires (wirings) are connected. In the sixth step, the second insulating layer 47 is stacked on the lower surface of the TAB sheet 45 such that the second through holes 47a are positioned at a central portion of the power feeding electrodes 46 (refer to FIG. 7B). The second through holes 47a are formed by a method such as an etching and a laser machining. Accordingly, the central portion of the power feeding electrodes 46 is exposed through the second through holes 47a, and the rest of the portion (the remaining portion) is covered by the second insulating layer 47, and the wires 46d connected to the power feeding electrodes 46 are also covered. It is possible to form the second insulating layer 47 by a method such as the photolithography and the screen printing, similarly as the first insulating layer 42.

Figure 7A:
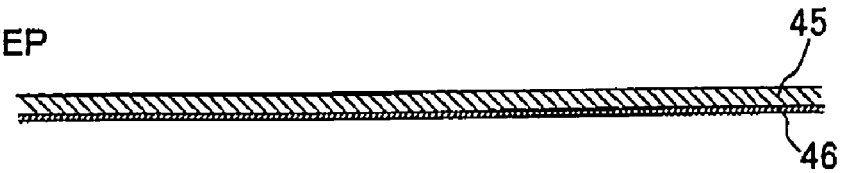
FIG. 7A to FIG. 7D are diagrams showing steps from a fifth step to an eighth step of the method of manufacturing the actuator.
Figure 7B:
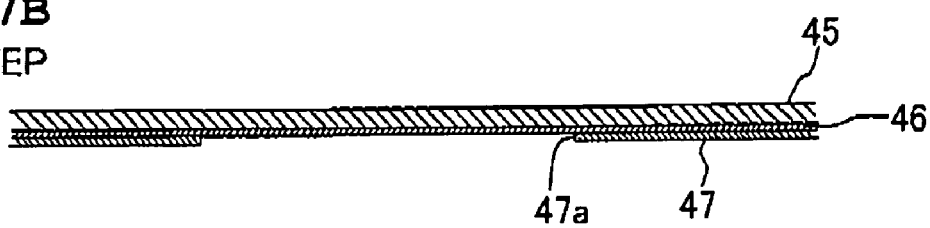
Figure 7C:
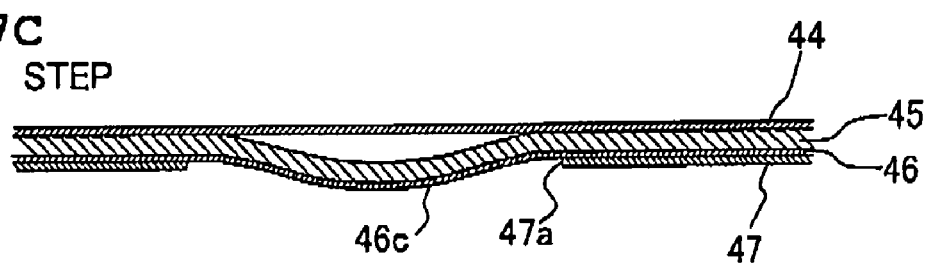

Further, in the seventh step, the bump 46c which protrudes downward is formed in the central portion of the power feeding electrodes 46 exposed through the second through holes 47a, by the press molding, and next, the holding plate 44 which is a metallic plate is joined to an upper surface of the TAB sheet 45 (refer to FIG. 7C). A height of the bump 46c is such that, a front end of the bump 46c protrudes from the lower surface of the second insulating layer 47. In other words, the front end of the bump 46c protrudes (sticks out) downward from a surface of lower portion opening of the second through holes 47a.

Figure 7D:
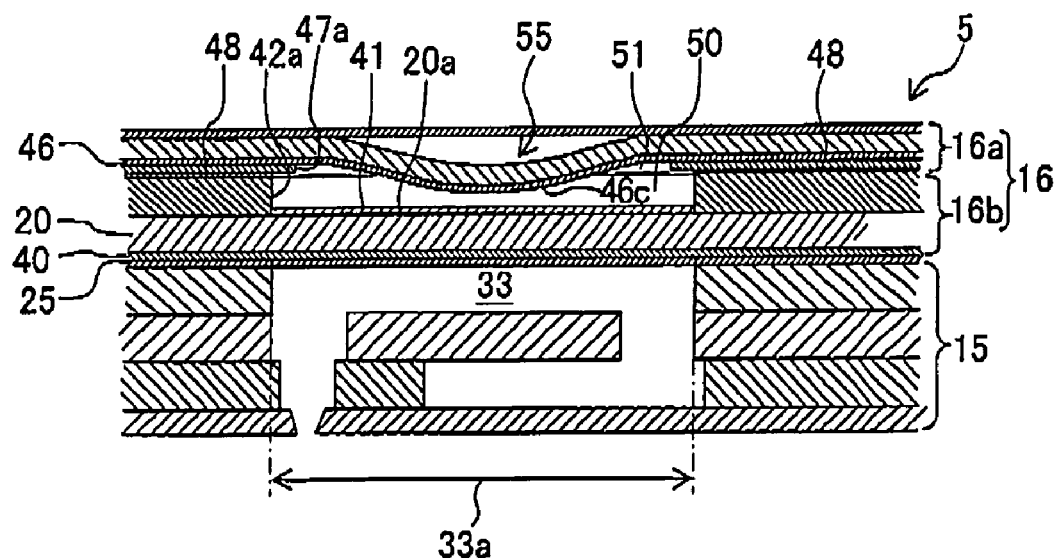

Finally, the chip on film 16a which is formed as described above is joined to the drive layer 16b which is formed in steps up to the fourth steps (refer to FIG. 7D). In other words, by connecting an upper surface of the first insulating layer 42 of the drive layer 16b, and the lower surface of the second insulating layer 47 of the chip on film 16a via the adhesive 48, the chip on film 16a is joined to the drive layer 16b, and the actuator 16 is manufactured.

Due to the joining, the bumps 46c of the chip on film 16a face the contact area 20a of the piezoelectric layer 20 and the liquid electroconductive material 50, and the first through holes 42a and the second through holes 47a communicate mutually, and the liquid electroconductive material 50 is filled into the liquid-tight electroconductive material accommodating space 51 which is formed by the first through holes 42*a*, the second through holes 47*a*, the piezoelectric layer 20 (or the drive electrodes 41), and the power feeding electrodes 46. Accordingly, a plurality of electric potential supply portions 55 which is formed by the bumps 46*c* of the power feeding electrodes 46, the drive electrodes 41, and the contact area 20*a* (refer to FIG. 7D) is positioned in the pressure chamber area 33*a* in a plan view. Furthermore, the power feeding electrode 46 and the drive electrode 41 are connected electrically by the liquid electroconductive material 50.

In the recording head 5 having the actuator 16 formed in such manner, when a voltage is applied to one of the power feeding electrodes 46 via the wires 46*d* (refer to FIG. 5), one of the drive electrodes 41 connected to the one of the power feeding electrodes 46 via the liquid electroconductive material 50 is at an electric potential which is different from an electric potential of the common electrode 40. Accordingly, an electric field is generated between the drive electrode 41 and the common electrode 40. Due to the generation of the electric field, a shape of the piezoelectric layer 20 sandwiched between the drive electrode 41 and the common electrode 40, is changed, and a shape of the vibration plate 25 is also changed. As a result, a volume of the pressure chamber 33 is changed and the ink in the pressure chamber 33 is jetted to an outside through the nozzle hole 24*a* via the liquid channel 30.

According to the liquid discharge apparatus 1 described above, since the electric potential supply portion 55 is positioned in the pressure chamber area 33*a* in a plan view, it is possible to form compactly the electric potential supply portion 55, and to integrate highly the pressure chambers 33 corresponding to this electric potential supply portion 55. Moreover, with the high integration of the pressure chambers 33, it is possible to make small the recording head 5, and to improve a resolution of an image which is formed by the liquid jetted.

In addition, since the power feeding electrodes 46 and the drive electrodes 41 are connected by the liquid electroconductive material 50, in spite of the contact area 20*a* of the piezoelectric layer 20 and the liquid electroconductive material 50 being positioned in the pressure chamber area 33*a*, a change in the shape of a portion of the piezoelectric layer 20 overlapping with the pressure chamber area 33*a* is not hindered due to the voltage applied. Consequently, since this overlapping portion of the piezoelectric layer 20 is substantially deformable, at the time of discharging the ink from the nozzle holes 24*a*, it is easy to control a degree of deformation of the piezoelectric layer 20, and to facilitate a decrease (reduction) in the voltage to be applied to the piezoelectric layer 20 at the time of deformation.

Moreover, since the extra space 51*a* (refer to FIG. 4) in addition to the volume occupied by the liquid electroconductive material 50 exists in the electroconductive material accommodating space 51, it is possible to accommodate the expanded volume in the extra space 51*a*, and to prevent the liquid electroconductive material 50 from leaking out from the electroconductive material accommodating space 51 even when the liquid electroconductive material 50 expands due to a heat generated at the time of driving the recording head 5.

Further, since in the actuator 16 according to the first embodiment, the liquid electroconductive material 50 is connected to the piezoelectric layer 20 via the drive electrode 41, it is possible to facilitate a reduction in an electrical resistance between the liquid electroconductive material 50 and piezoelectric layer 20. In other words, by using the drive electrode 41 having a smooth surface, it is possible to make substantial a contact area between the drive electrode 41 and the liquid electroconductive material 50. Consequently, it is possible to lower a resistance between the piezoelectric layer 20 and the liquid electroconductive material 50 as compared to a case in which the liquid electroconductive material 50 and the piezoelectric layer 20 having a normal rough surface are brought into direct contact.

Second Embodiment

Figure 8:
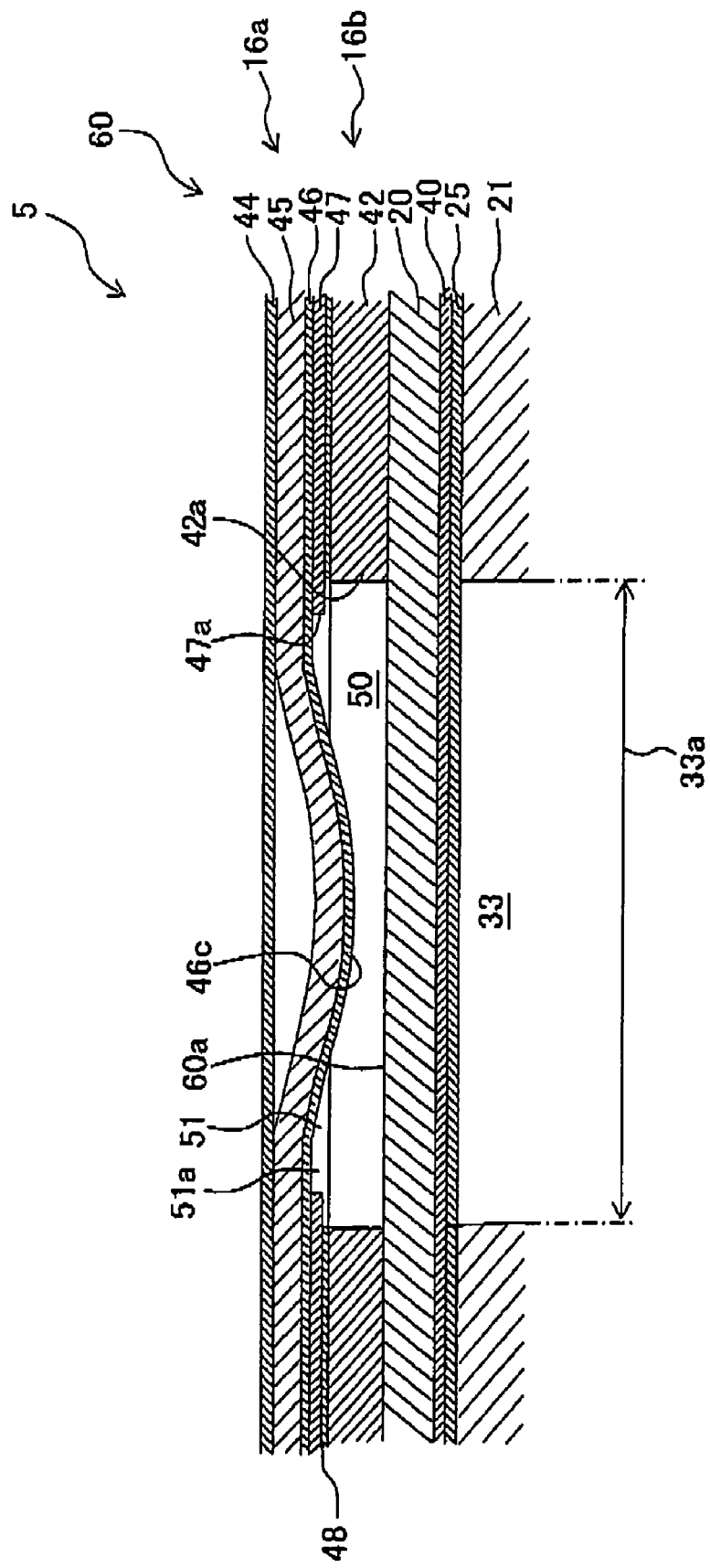
FIG. 8 is a partial cross-sectional view showing a structure of an actuator in a liquid discharge apparatus according to a second embodiment.

FIG. 8 is a partial cross-sectional view showing a structure of an actuator 60 in a liquid discharge apparatus 1A according to a second embodiment. In this actuator 60, the drive electrode 41 is not provided on the upper surface of the piezoelectric layer 20, and the liquid electroconductive material 50 filled in the electroconductive material accommodating portion 51 is connected directly to the upper surface of the piezoelectric layer 20. Moreover, a contact area 60*a* between the liquid electroconductive material 50 and the piezoelectric layer 20 (same as a lower portion opening area of the first through hole 42*a* in the second embodiment) is positioned in the pressure chamber area 33*a*. Except for the structure as described above, the actuator 60 has a similar structure as compared with that of the actuator 16 described in the first embodiment, the same reference numerals are assigned to corresponding components, and the description of such components is omitted.

Moreover, a producing method of such actuator 60 is the same as a producing method for the actuator 16 except that the second step (step of arranging the drive electrode 41) described in the first embodiment and shown in FIG. 6B is omitted. Therefore, the producing method for the actuator 60 includes the first step, and the third step to the eighth step. Consequently, the description of the producing method of the actuator 60 refers to the description of the producing method of the actuator 16 in the first embodiment, and the description in detail is omitted here.

Even in the liquid discharge apparatus 1A in which the recording head 5 having such actuator 60 is mounted, the power feeding electrodes 46 and the contact areas 60*a* are positioned to overlap with the pressure chamber area 33*a* in a plan view. In other words, the power feeding electrodes 46 and the contact areas 60*a* overlap with the pressure chambers 33. Since the compactness of a shape in a plan view is facilitated, it is possible to realize a high integration of the pressure chamber 33, and a reduction in size of the recording head 5. In addition to this, since the power feeding electrodes 46 and the piezoelectric layer 20 are connected by the liquid electroconductive material 50, a change in the shape of the piezoelectric layer 20 positioned in the pressure chamber area 33*a* is not hindered due to the applied voltage. Further, since the actuator 60 is not provided with the drive electrodes 41, the number of components and the number of manufacturing steps of the liquid discharge apparatus 1A are reduced, and it is possible to facilitate a reduction in cost.

Third Embodiment

FIGS. 9A and 9B are diagrams showing a structure of an actuator 65 in a liquid discharge apparatus 1B according to a third embodiment. FIG. 9A shows a partial cross-sectional view and FIG. 9B shows a plan view of a first insulating layer. As shown in FIG. 9A, in the actuator 65, out of a peripheral portion of each of the second through holes 47*a* in the second insulating layer 47, a lower side portion facing the electroconductive material accommodating space 51 is a tapered portion 65*a* which has a slanted notch. Consequently, the volume of the electroconductive material accommodating space 51 has become large, and it is possible to accommodate further increase in the volume of the liquid electroconductive material 50 when expanded due to heat.

Moreover, as shown in FIGS. 9A and 9B, a recess 65b which opens in a surface (upper surface) facing the second insulating layer 47 is formed near the first through holes 42a in the first insulating layer 42. The recess 65b, as shown in FIG. 9B, is formed to surround the first through holes 42a in a plan view. Consequently, at the time of joining the chip on film 16a to the drive layer 16b, even when the liquid electroconductive material 50 has leaked out from the first through holes 42a due to the immersion of the bumps 46c, the leaked liquid electroconductive material 50 is accommodated in the recess 65b, and it is possible prevent the liquid electroconductive material 50 from leaking to the outside.

Further, even in the liquid discharge apparatus 1B in which the recording head 5 having such actuator 65 is mounted, it is possible to facilitate the high integration of the pressure chambers 33 and the compactness of the recording head 5 similarly as in the first embodiment and the second embodiment described above, and the change in the shape of the piezoelectric layer 20 positioned in the pressure chamber area 33a is not hindered due to the voltage applied to the piezoelectric layer 20.

The structure of the actuator 65 is similar to the structure of the actuator 16 described in the first embodiment except that the structure as described above, the same reference numerals are assigned to corresponding components, and the description of such components is omitted.

Fourth Embodiment

Figure 10:
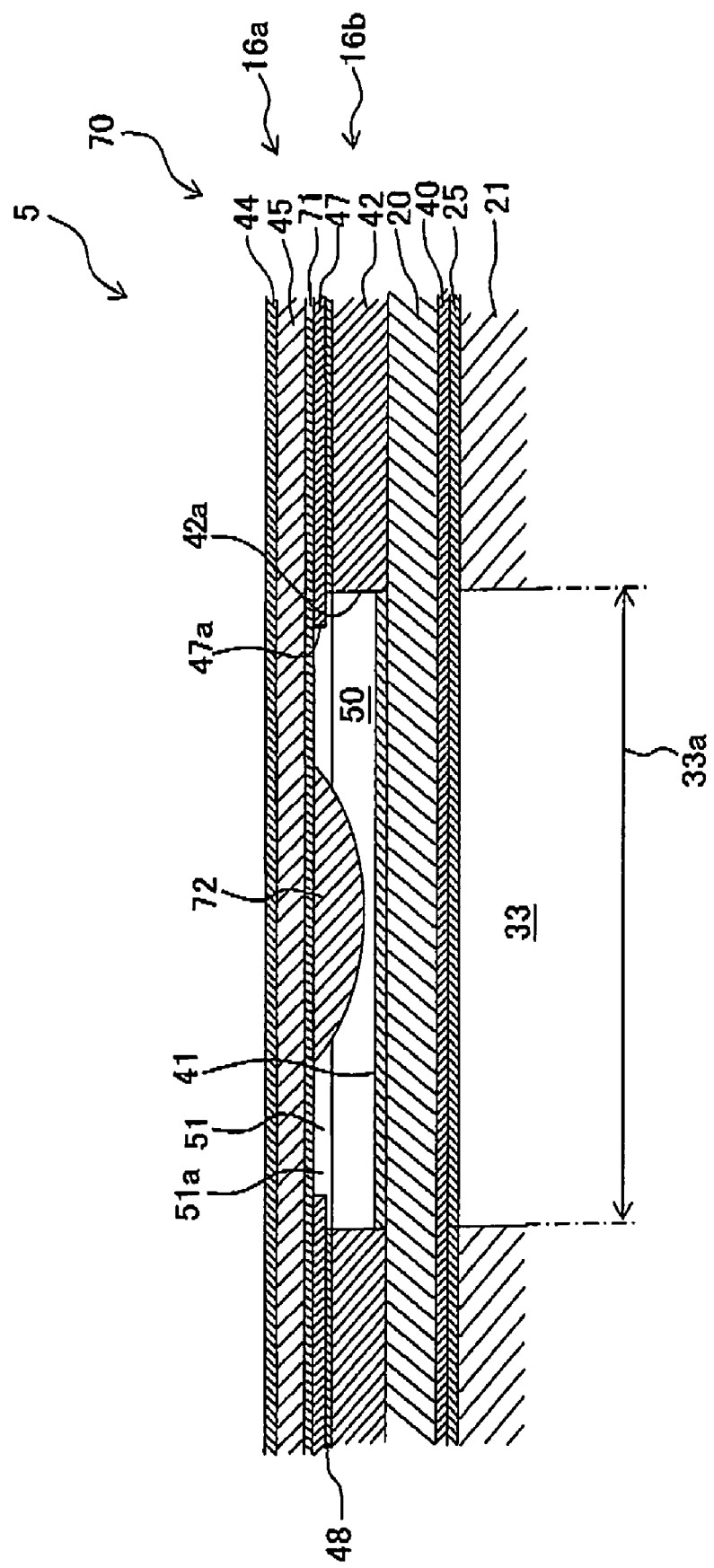
FIG. 10 is a partial cross-sectional view showing a structure of an actuator in a liquid discharge apparatus according to a fourth embodiment.

FIG. 10 is a partial cross-sectional view showing a structure of an actuator 70 of a liquid transporting apparatus 1C according to a fourth embodiment. As shown in FIG. 10, in a case of the actuator 70, each of the power feeding electrodes 71 has a solder bump 72 which is formed by performing soldering, instead of the bump 46a according to the first embodiment which is formed by press (press molding). Even with such structure, it is possible to immerse the solder bump 72 into the liquid electroconductive material 50, and to connect the power feeding electrode 71 and the drive electrode 41 via the liquid electroconductive material 50.

Further, even in the liquid discharge apparatus 1 in which the recording head 5 having such actuator 70 is mounted, it is possible to facilitate the high integration of the pressure chamber 33 and the compactness of the recording head 5 similarly as in the embodiments from the first embodiment to the third embodiment described above, and the change in the shape of the piezoelectric layer 20 positioned to overlap the pressure chamber area 33a is not hindered due to the voltage applied to the piezoelectric layer 20.

The structure of the actuator 70 is similar to that of the actuator 16 described in the first embodiment except that the structure as described above, the same reference numerals are assigned to corresponding components, and the description of such components is omitted.

Fifth Embodiment

Figure 11:
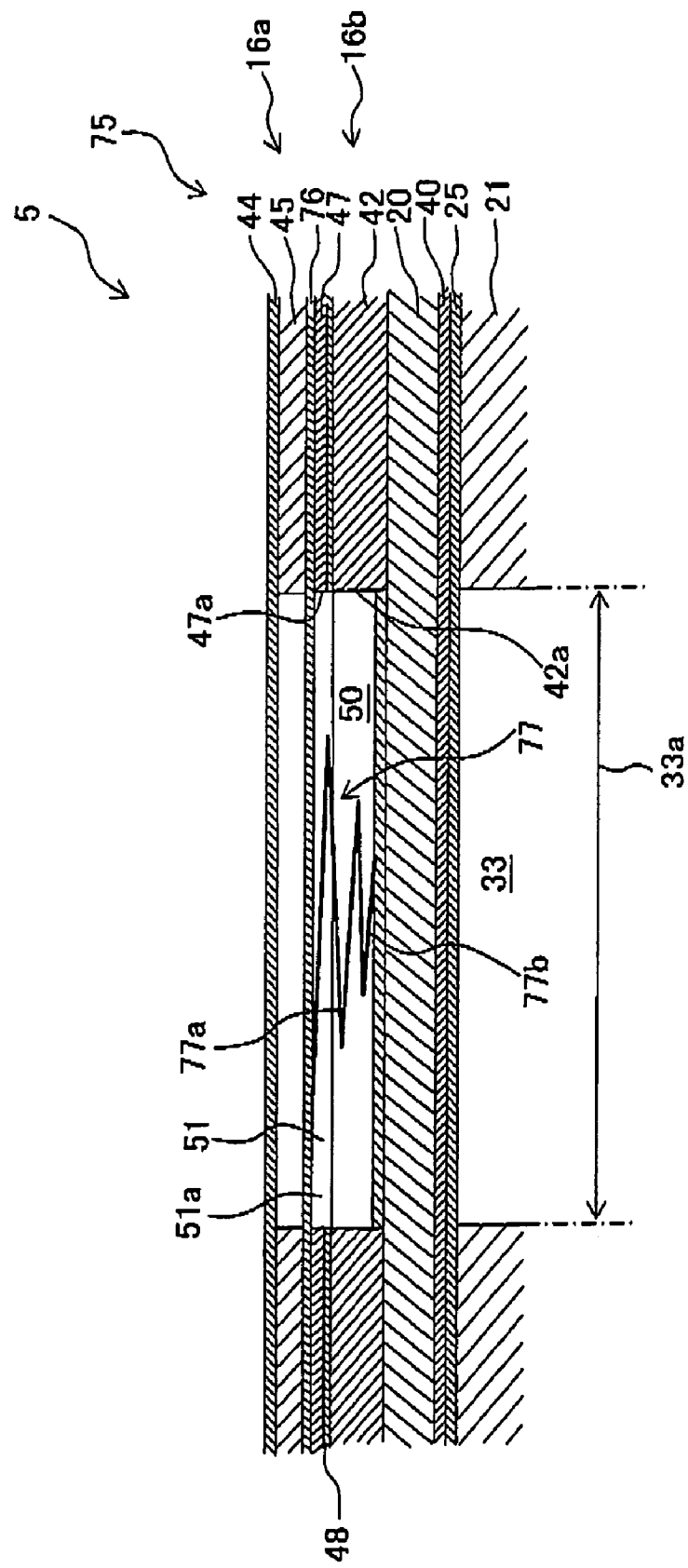
FIG. 11 is a partial cross-sectional view showing a structure of an actuator in a liquid discharge apparatus according to a fifth embodiment.

FIG. 11 is a partial cross-sectional view showing a structure of an actuator 75 in a liquid discharge apparatus 1D according to a fifth embodiment. As shown in FIG. 11, each of the power feeding electrode 76 of the actuator 75 has a spiral contact 77 of a metallic material, instead of the bump 46c according to the first embodiment which is formed by press (press molding), and the solder bump 72 according to the fourth embodiment.

Figure 12:
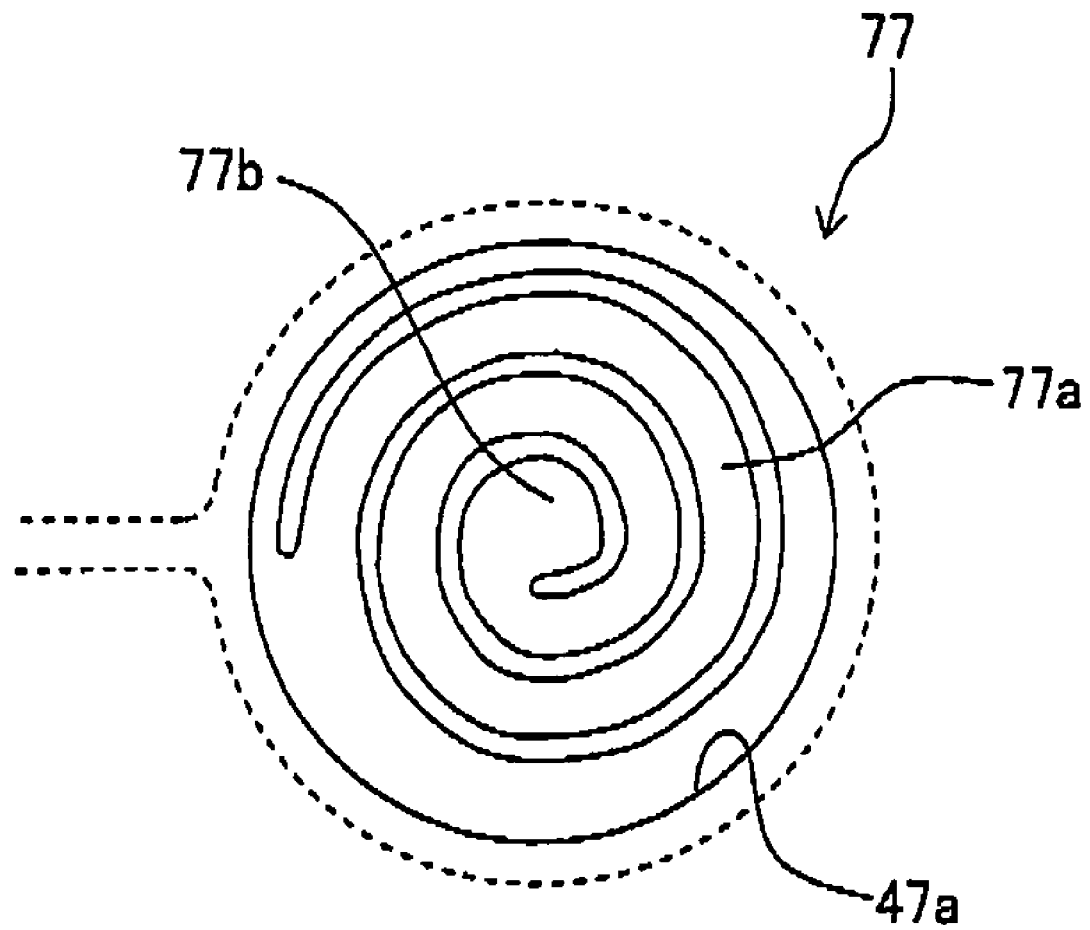
FIG. 12 is a bottom view showing a structure of a spiral contact.

In the spiral contact 77 as shown in a bottom view in FIG. 12, a metal terminal 77a is form to be spiraled in a helical form from an outer peripheral portion toward a center. Further, as shown in FIG. 11, since the spiral contact is protruded downward as it is spiraled toward the center, it is formed to be a reverse triangular shape (a shape of a triangle turned upside down) in a side view of the overall structure. Moreover, a lower portion of the spiral contact 77 is immersed into the liquid electroconductive material 50, and a lower end portion 77b makes a direct contact with the drive electrode 41. Consequently, by structuring in such manner, the power feeding electrodes 76 and the drive electrodes 41 are connected assuredly via the liquid electroconductive material 50. Further, since an area of contact of the spiral contact 77 with the liquid electroconductive material 50 is substantial, it is possible to reduce a contact resistance between the power feeding electrodes 76 and the drive electrodes 41.

Further, even in the liquid discharge apparatus 1D in which the recording head 5 having such actuator 75 is mounted, it is possible to facilitate the high integration of the pressure chamber 33 and the compactness of the recording head 5 similarly as in the embodiments from the first embodiment to the fourth embodiment. Furthermore, the change in the shape of the piezoelectric layer 20 positioned to overlap the pressure chamber area 33a is not hindered due to the voltage applied to the piezoelectric layer 20.

The structure of the actuator 75 is similar to that of the actuator 16 described in the first embodiment except for the structure as described above, the same reference numerals are assigned to corresponding components, and the description of such components is omitted.

Types of Liquid Electroconductive Material

Incidentally, as the liquid electroconductive material 50 in each of the actuators 16, 60, 65, 70, and 75 described above, it is possible to use a known material having a predetermined fluidity (flow property) and a predetermined electroconductivity at the time of using such actuator 16.

For instance, it is possible to use an electroconductive adhesive which is used for supporting a quartz vibrator (crystal resonator) as the liquid electroconductive material 50. As such electroconductive adhesive, material such as a base material such as an epoxy resin, a polyimide resin, and a silicon resin (also called as a binder), and an electroconductive filler in which a powder of a metal or an electroconductive material (electroconductive powder) such as gold, silver, copper, nickel, aluminum, carbon, and graphite is kneaded with a base material may be used. From a point of view of securing the fluidity, it is preferable to use a silicon resin as the base material. As a commercially available product, a product from among 3300 series manufactured by ThreeBond Co., Ltd, or a product from a DOTITE SERIES of Fujikura Chemical Industry Co., Ltd. may be used.

Moreover, it is also possible to use an ionic liquid of a low fusing point (low melting point). A vapor pressure of an ionic liquid is almost zero, and an ionic liquid is fire resistant, and has a peculiarity of a low viscosity and a high electroconductivity. Compounds such as imidazolium compounds, pyridium compounds, and aliphatic compounds are available as an ionic liquid. As imidazolium ionic liquids, AEImBr, AEImBF4, AEImTFSI, ABImBr, ABImBF4, ABImTFSI, AAImBr, AAImBF4, AAImTFSI (precisely, 1-aryl-3-alkylimidazolium compounds) manufactured by Kanto Kagaku Co., Ltd. are examples of commercially available products. Moreover, as aliphatic ionic liquids, TMPA TFSI, PP13 TFSI, P13 TFSI, and P14 TFSI etc. manufactured by Kanto Kagaku Co., Ltd. are available.

Apart from this, known electroconductive polymers (such as Baytron PEDOT manufactured by TA Chemical Co.) and galinstan which is a liquid metal at a room temperature may be used.

As to which material is to be used as the liquid electroconductive material 50 may be decided appropriately upon considering factors such as a volume resistivity ($\Omega$ cm) of each material and a contact resistance (m$\Omega$) of the drive electrodes 41 and the power feeding electrodes 46, 71, and 76 which are in contact with the liquid electroconductive material 50, in addition to a fluidity (in other words, a hardening (curing) property) in a temperature range of the actuators 16, 60, 65, 70, and 75 when the liquid discharge apparatus 1 is being used. The liquid electroconductive material 50 has been described citing various examples. However, the liquid electroconductive material of the present invention is not restricted to the liquid electroconductive material 50 described above.

In the embodiments from the first embodiment to the fifth embodiment described above, the first through holes 42a and the second through holes 47a having a rhombus shaped opening have been described. However, without restricting to the rhombus shape, it may be other shape. Moreover, the entire opening area of the first through holes 42a and the second through holes 47a is not required to be overlapped entirely with the pressure chamber area 33a, and may overlap partially in a plan view. Similarly, the structure is not necessarily let to be such that the drive electrodes 41, and the power feeding electrodes 46, 71, and 76 (particularly, the bumps 46c, the solder bumps 72, and the spiral contacts 77) exist only in the pressure chamber area 33a, and may overlap partially in a plan view.

Moreover, the existence of the bump 46c, the solder bump 72, and the spiral contact 77 is for an assured connection between the power feeding electrodes 46, 71, and 76, and the liquid electroconductive material 50. However, it is not indispensable, and a lower surface of the power feeding electrodes 46, 71, and 76 may be an arbitrary shape, provided that the power feeding electrodes 46, 71, and 76 and the drive electrode 41 are connected via the liquid electroconductive material 50. For example, the lower surface of the power feeding electrodes 46, 71, and 76 may be flat.

Further, any of the actuators 16, 60, 65, 70, and 75 described above is a unimorph actuator. However, it is also applicable to a bimorph actuator. For example, when an arrangement is made by replacing the actuators 16, 60, 65, 70, and 75 by a bimorph actuator, from among the plurality of electrodes of the bimorph actuator, connections of the drive electrode 41 and the power feeding electrodes 46, 71, and 76 are applicable to electrical connections of electrodes positioned at an extreme end on a side opposite to a side of the pressure chamber 33, and the power feeding electrodes. In the embodiments described above, examples in which the piezoelectric layer is formed by the AD method have been cited. However, the method of forming the piezoelectric layer in the present invention is not restricted the AD method, and a piezoelectric layer formed by baking a green sheet of PZT may be used, or a piezoelectric layer formed by an arbitrary method may be used.

The present invention is applicable to a liquid discharge apparatus, in which it is possible to change appropriately a shape of a piezoelectric layer while realizing a size reduction of a channel unit and an improvement in a resolution of an image which formed by a liquid jetted.

What is claimed is:

1. A liquid discharge apparatus which discharges a liquid, comprising:
 a liquid channel in which a discharge port through which the liquid is discharged is formed at one end of the liquid channel and a pressure chamber which stores the liquid is formed in an intermediate portion of the liquid channel;
 a piezoelectric layer which deforms to change a volume of the pressure chamber when a voltage is applied to the piezoelectric layer, the piezoelectric layer having one surface facing the pressure chamber;
 a power feeding electrode which is electrically connected to the piezoelectric layer to apply the voltage to the piezoelectric layer; and
 a liquid electroconductive material which electrically connects the other surface of the piezoelectric layer and the power feeding electrode;
 wherein a contact area is formed, on the other surface of the piezoelectric layer, the contact area overlapping with the pressure chamber, the piezoelectric layer and the liquid electroconductive material being electrically contacted via the contact area; and
 wherein a drive electrode overlaps with the contact area and is joined on the other surface of the piezoelectric layer, the piezoelectric layer and the power feeding electrode being connected electrically with the liquid electroconductive material via the drive electrode.

2. The liquid discharge apparatus according to claim 1;
 wherein an electroconductive material accommodating space which is liquid-tight and which accommodates the liquid electroconductive material is formed between the contact area of the piezoelectric layer and the power feeding electrode.

3. The liquid discharge apparatus according to claim 2;
 wherein the electroconductive material accommodating space has an extra volume in addition to a volume for accommodating the liquid electroconductive material.

4. The liquid discharge apparatus according to claim 2, further comprising:
 a first insulating layer which is provided on the other surface of the piezoelectric layer;
 wherein a first through hole in which the contact area is exposed and which defines the electroconductive material accommodating space is formed in the first insulating layer.

5. The liquid discharge apparatus according to claim 4, further comprising:
 a circuit board including a substrate on one surface of which the power feeding electrode is provided, a wire which is provided on the one surface of the substrate to be electrically connected with the power feeding electrode, and a second insulating layer which covers the wire on the substrate;
 wherein a second through hole in which a surface, of the power feeding electrode, facing the contact area is partially exposed is formed in the second insulating layer; and the first insulating layer and the second insulating layer are joined such that the first through hole and the second through hole communicate mutually to define the electroconductive material accommodating space.

6. The liquid discharge apparatus according to claim 4;
 wherein the power feeding electrode has a bump which is protruded toward the piezoelectric layer to be inserted into the first through hole.

7. The liquid discharge apparatus according to claim 6;
 wherein the bump is one of a press bump which is formed by pressing the power feeding electrode, a solder bump which is formed by performing soldering on the power feeding electrode, and a spiral contact.

8. The liquid discharge apparatus according to claim 4;
 wherein a recess which is capable of accommodating the liquid electroconductive material leaked out from the first through hole, is formed around the first through hole formed in the first insulating layer.

* * * * *